United States Patent [19]
Hsu et al.

[11] Patent Number: 5,731,608
[45] Date of Patent: Mar. 24, 1998

[54] ONE TRANSISTOR FERROELECTRIC MEMORY CELL AND METHOD OF MAKING THE SAME

[75] Inventors: Sheng Teng Hsu; Jong Jan Lee, both of Camas, Wash.

[73] Assignees: Sharp Microelectronics Technology, Inc., Camas, Wash.; Sharp Kabushiki Kaisha, Osaka, Japan

[21] Appl. No.: 812,579

[22] Filed: Mar. 7, 1997

[51] Int. Cl.$^6$ .................................................. H01L 21/8242
[52] U.S. Cl. ...................... 257/295; 438/240; 438/3; 438/250
[58] Field of Search ...................... 438/3, 250, 239, 438/240, 393; 365/145; 257/295

[56] References Cited

U.S. PATENT DOCUMENTS

| | | |
|---|---|---|
| 3,832,700 | 8/1974 | Wu et al. . |
| 4,419,809 | 12/1983 | Riseman et al. . |
| 5,070,029 | 12/1991 | Pfiester et al. . |
| 5,180,681 | 1/1993 | Mishra et al. ........................ 438/197 |
| 5,300,799 | 4/1994 | Nakamura et al. . |
| 5,303,182 | 4/1994 | Nakao et al. . |
| 5,345,415 | 9/1994 | Nakao et al. . |
| 5,365,094 | 11/1994 | Takasu . |
| 5,373,462 | 12/1994 | Achard et al. . |
| 5,416,735 | 5/1995 | Onishi et al. . |
| 5,431,958 | 7/1995 | Desu et al. . |
| 5,446,688 | 8/1995 | Torimaru . |
| 5,536,666 | 7/1996 | Miller et al. ........................ 438/142 |
| 5,585,289 | 12/1996 | Kitano ........................ 438/142 |

OTHER PUBLICATIONS

Jiang et al. "A New Electrode Technology for High–Density Nonvolatile Ferroelectric (SrBi$_2$Ta$_2$O$_9$) Memories" IEEE 1996 Symposium on VLSI Technology Digest of Technical Papers, pp. 26–27, 1966.

*Primary Examiner*—Jey Tsai
*Attorney, Agent, or Firm*—David C. Ripma; Gerald W. Maliszewski

[57] ABSTRACT

A method of forming a semi-conductor structure forming, on a prepared substrate, a ferroelectric memory (FEM) gate unit. A gate junction region is formed between the source junction region and the drain junction region for the FEM gate unit on a FEM gate unit device area, which FEM gate unit includes a lower metal layer, a ferroelectric (FE) layer, and an upper metal layer, and which is formed on a conductive channel precursor.

The structure of the semiconductor includes a substrate, which may be either bulk silicon or SOI-type silicon, conductive channels of first and second type formed above the substrate, an FEM gate unit formed above a channel region, wherein the FEM gate unit includes a lower metal layer, an FE layer, and an upper metal layer, and wherein a conductive channel of a second type is formed under the FEM gate unit.

18 Claims, 3 Drawing Sheets

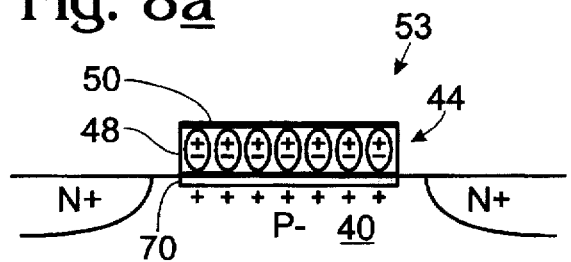
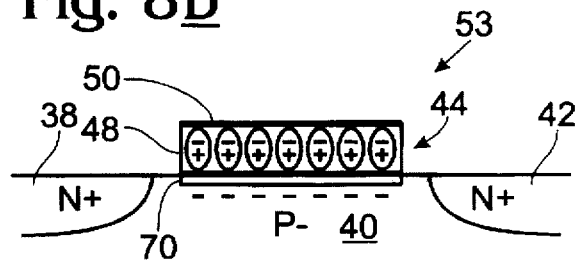
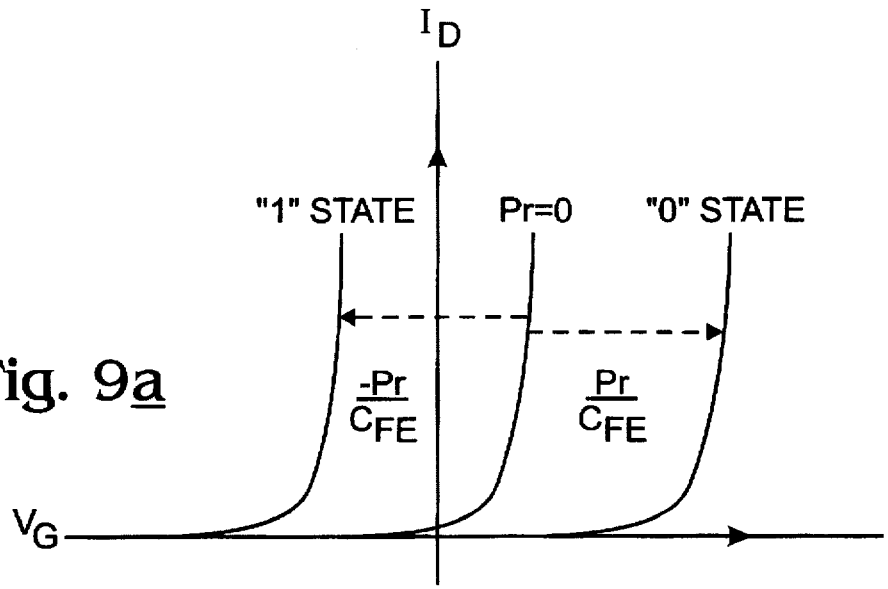
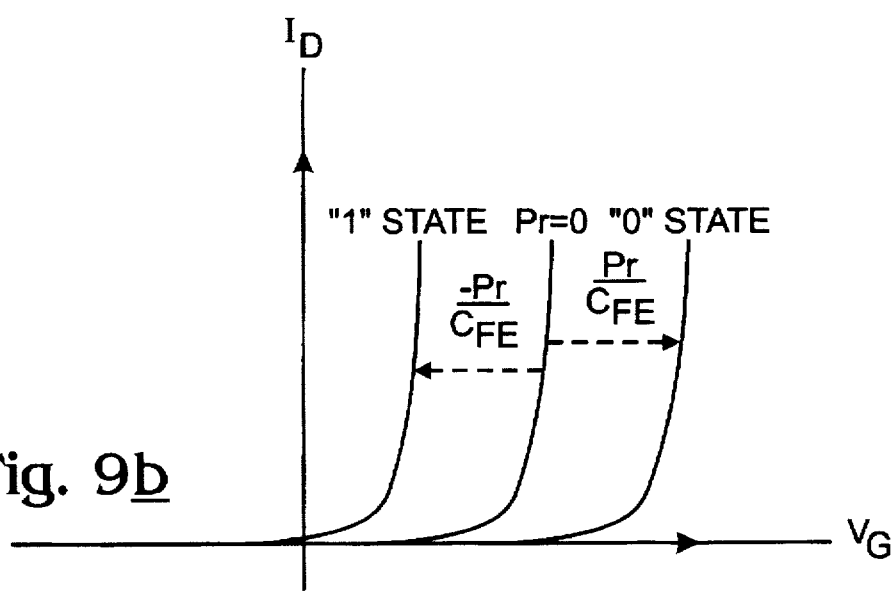

ONE TRANSISTOR FERROELECTRIC MEMORY CELL AND METHOD OF MAKING THE SAME

BACKGROUND OF THE INVENTION

This application relates to ferroelectric thin films which are used in nonvolatile memories and specifically to a metal-ferroelectric-metal-silicon semiconductor. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAMs have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A FEM structure on a gate region is shown in U.S. Pat. No. 5,303,182, which emphasizes that the transfer of metal ions into the gate region is undesirable. Similar structure is shown in U.S. Pat. No. 5,416,735.

It is an object of this invention to overcome the aforementioned problems.

Another object of the invention is to provide an MFS FET device which provides a non-destructive readout.

Yet another object of the invention to provide an MFS FET device that occupies a relatively small surface area.

A further object of the invention is to provide an MFS FET device which requires a relatively low programming voltage.

The method of forming the FEM cell semi-conductor structure of the invention includes forming a device area for the ferroelectric memory (FEM) gate unit on a silicon substrate. Appropriate impurities are implanted into the device area to form conductive channels, for use as a source junction region, a gate junction region and a drain junction region. A FEM cell includes a FEM gate unit formed on the substrate. A gate junction region is formed between the source junction region and the drain junction region for the FEM gate unit on the FEM gate unit device area, which FEM gate unit includes a lower metal layer, a ferroelectric (FE) layer, and an upper metal layer. A Schottky barrier or a very shallow junction layer is formed between the FEM gate unit and the gate junction region, as another conductive channel. The FEM gate unit is spaced apart from the source region and the drain region. Formation of the various conductive channels may take place at various stages of the manufacture, depending on what other devices are built on the substrate, and depending on the efficiencies of the various orders of construction.

The structure of the FEM cell semiconductor includes a substrate, which may be a bulk silicon substrate or an SOI-type substrate, conductive channels of first and second type formed above the substrate, an FEM gate unit formed above a gate region, wherein the FEM gate unit includes a lower metal layer, an FE layer, and an upper metal layer, and wherein a conductive channel of a third type is formed between the FEM gate unit and the gate region. The FEM cell may be constructed in series with a conventional MOS transistor.

These and other objects and advantages of the invention will become more fully apparent as the description which follows is read in conjunction with the drawings.

FIGS. 8A and 8B depict the basic operation principle for the MFS FET devices of the invention.

FIGS. 9A and 9B is a graph of $I_D$ vs. $V_G$ for the FEM gate unit of the invention.

DETAILED DESCRIPTION OF THE PREFERRED EMBODIMENTS

The ferroelectric memory (FEM) cell of the invention may be formed on a SOI (SIMOX) substrate, or, it may be formed in a bulk silicon substrate which has a p⁻ well formed therein. The initial description will concentrate on the formation of the FEM gate unit on a SIMOX substrate. It should be appreciated that in some embodiments of the FEM gate unit, a MOS transistor is fabricated simultaneously with the ferroelectric memory cell by conventional means which are well known to those of ordinary skill in the art. Accordingly, for the sake of clarity, the drawings do not depict the formation of the MOS transistor.

Figure 1:
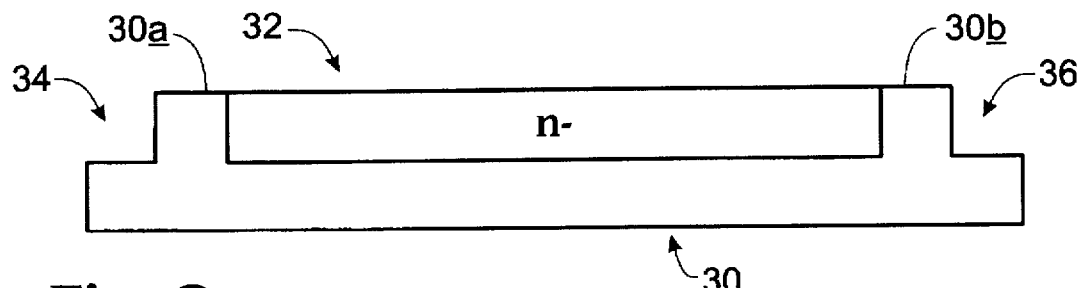
FIGS. 1 and 2 depict exemplars of successive steps in the formation of the substrate used for the FEM cell of the invention.

Turning now to FIG. 1, a SIMOX substrate is depicted at 30. Substrate 30, in the preferred embodiment, is formed of SiO$_2$, and is a single-crystal substrate. As depicted in FIG. 1, substrate 30 has been partially etched to the configuration depicted, and a portion of the substrate has been lightly doped to form an active region, or device area, 32, which provides a desired background polarity, in this case, that of an n$^-$ region. As is well known to those of a skill in the art, a multiplicity of such regions are formed on the surface of a silicon wafer. For the FEM gate unit of the invention, the cells are arranged in a perpendicular grid to form a memory array.

The initial description is a general method of forming and preparing the substrate that the FEM gate unit will overlay, ultimately resulting in a FEM memory cell. Active region 32 is bordered by non-active, or insulation regions 30a, 30b, which are upward extensions of substrate 30. An area of the substrate is trenched as depicted generally at 34, 36, which trench regions will ultimately be filled with an insulating material, usually SiO$_2$.

Figure 2:
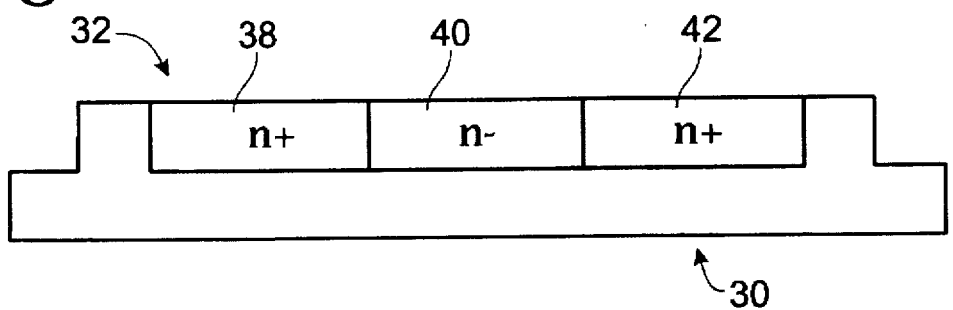

Turning now to FIG. 2, active region 32 may be seen to have been modified to a source region 38, a gate region 40, a drain region 42. These regions are formed by applying a photoresist across active region 32 to mask what will ultimately be gate region 40, and implanting the appropriate ions in the remainder of active region 32 to form two n$^+$ layers, also referred to herein as conductive channels of a first type, which will serve as source region 38 and drain region 42. Appropriate ion implantation in this instance may be the implantation of As ions at a preferred energy of about 50 keV, although implantation in a range of 40 keV to 70 keV is acceptable, and a dosing in a range of $2 \cdot 10^{15}$ cm$^{-2}$ to $5 \cdot 10^{15}$ cm$^{-2}$. Alternately, phosphorus ions may be implanted in an energy range of 30 keV–60 keV in the same dosing range. The wafer is then heat treated to activate and defuse the implanted ions. Temperature range for the heat treatment is in the range of 500° C. to 1100° C.

Figure 3:
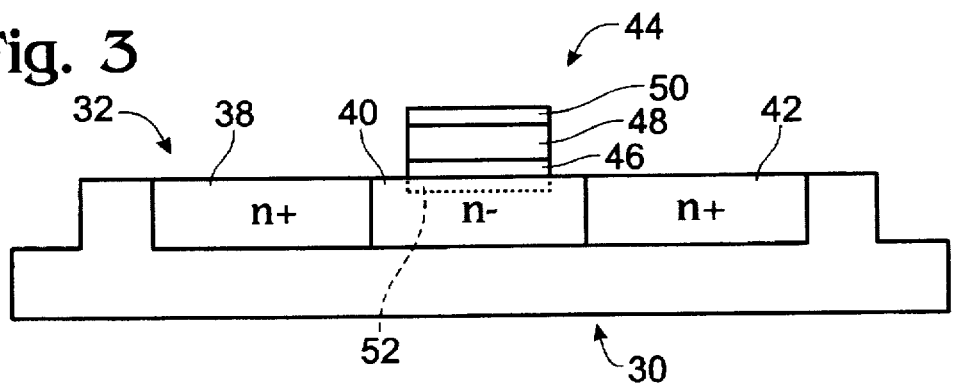
FIG. 3 depicts the FEM gate unit constructed on the substrate.

At this point, formation of the FEM gate unit may begin. Referring now to FIG. 3, a FEM gate unit is identified generally at 44 and includes a lower electrode 46, the ferroelectric (FE) material 48 and a upper electrode 50. The construction of FEM gate unit 44 begins with the deposition of the lower electrode on gate region 40, also referred to herein as a conductive channel of a second type. Lower electrode 46 may be formed of Pt or Ir, an alloy of Pt/Ir, or other suitable conductive material. The thickness of this metal is 20 nm to 100 nm.

Next, the FE material is deposited by chemical vapor deposition (CVD). The FE material may be any of the following: Pb(Zr, Ti)O$_3$ (PZT), SrBi$_2$Ta$_2$O$_9$ (SBT), Pb$_5$Ge$_3$O$_{11}$ BaTiO$_3$, or LiNbO$_3$. The preferred compounds are, in order of preference, Pb$_5$Ge$_3$O$_{11}$ SBT and PZT. Most of the experimental work in the FEM gate unit field has been done on PZT compounds. The FE material 48 is deposited to a thickness of 100 nm to 400 nm.

The upper electrode 50 is then formed over the FE material. The upper electrode may be formed of the same materials as the lower electrode, to a thickness of 20 nm to 200 nm. A conductive channel precursor is identified at 52. This precursor will ultimately become a metal silicide layer by diffusion of metal ion from lower electrode 46 into the gate region 40.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

Figure 4:
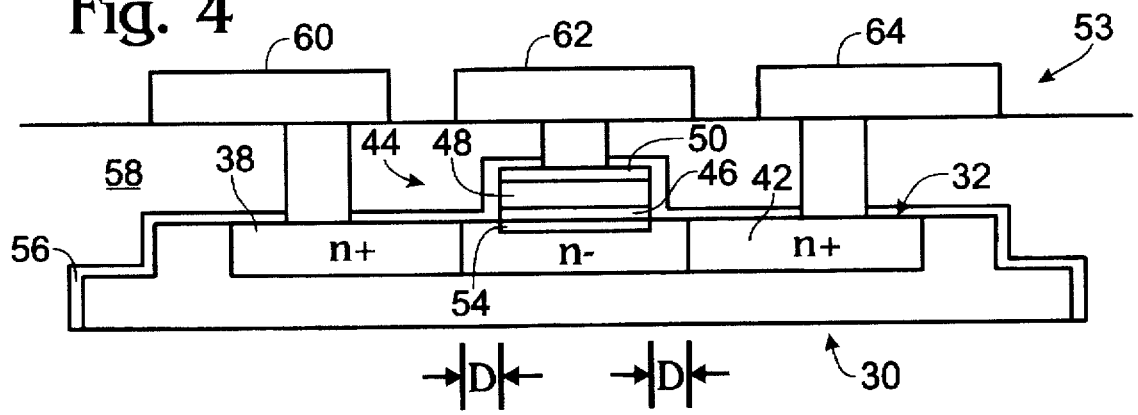
FIG. 4 depicts the first embodiment of the FEM cell of the invention having a silicide layer formed under the FEM gate unit.

Turning now to FIG. 4, FEM gate unit 44 is depicted as part of a FEM memory cell 53, which includes FEM gate unit 44 and the underlying source, channel and drain regions, which embodiment includes a thin layer of silicide 54 formed under FEM gate unit 44, where conductive channel precursor 52 was located. Silicide layer 54 may be formed prior to the deposition of the components of FEM gate unit 44, as described in connection with a second embodiment of the method of the invention, or, assuming that lower electrode 46 is formed of platinum (Pt), or an alloy thereof, the platinum may be allowed to diffuse into the upper portion of gate region 40, forming a shallow silicide layer which acts as a Schottky barrier, which is referred to herein as a conductive channel of a third type.

A layer of TiO, 56, or other suitable barrier insulation material is formed by CVD to protect the FEM gate unit. The TiO is etched to form the sidewall insulator for the gate electrode. Photoresist is applied and appropriate n$^+$ and p$^+$ regions are formed by ion implantation. An oxide layer is formed by CVD, or, other suitable passivation insulation is applied. The structure is heat treated, at between 500° C. and 1100° C., to allow passivation and diffusion of the implanted ions. To complete the description of FEM cell 53, bores are formed in oxide layer 58 and a source electrode 60, a gate electrode 62 and a drain electrode 64 and connected to their respective components.

The embodiment depicted in FIG. 4 represents the simplest case of the structure of the invention. The structure is a ferroelectric gate depletion-type MIS transistor. At zero gate voltage, the charge in the n$^-$ channel underlying the FEM gate unit is completely depleted. Accordingly, the leakage current is very small. In order to maintain the small leakage, the distance between the point at which any edge of lower electrode 46 contacts the n$^-$ silicon and the edges of the n$^+$ source or n$^+$ drain regions, represented by "D", has to be at least 50 nm in order that the leakage current remain small. However, as D increases, the series resistance of the memory cell also increases. It is therefore preferred that D be no larger than 300 nm. The gate leakage current is determined by the platinum to n$^-$ type silicon Schottky barrier and the platinum to ferroelectric material contact. The leakage current is the gate current at a very small up to moderate field intensity. The potential barrier between the platinum and n$^-$ type silicon is 0.9 eV. A potential barrier of this magnitude causes the n$^-$ type silicon channel to be completely depleted when the ferroelectric material is not polarized, or when the ferroelectric material is polarized with negative charge at the lower electrode. When the ferroelectric material is polarized with a positive charge at the lower electrode, the threshold voltage of the memory transistor is small. The nature of these memory charges and techniques for changing the amount of voltage necessary to the program the cells will be described later herein.

Figure 5:
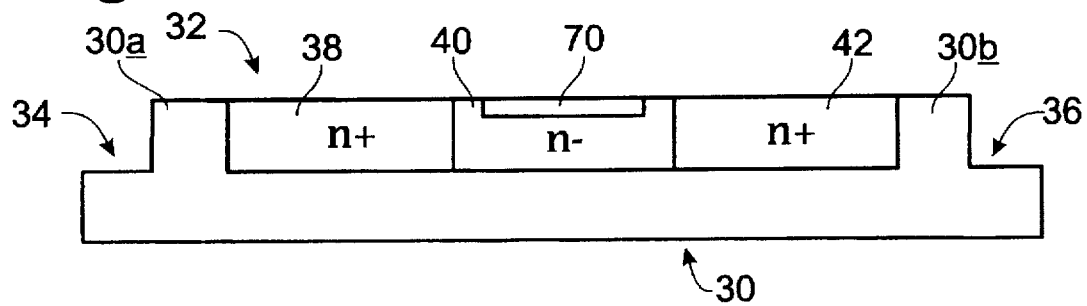
FIG. 5 depicts preparation of the substrate as used in a second embodiment of the invention.

In a second embodiment of the MFMS FET of the invention, and now referring to FIG. 5, a p$^-$ layer 70 may be formed in gate channel region 40 as a conductive channel precursor. Substrate 30 and active region 32 are formed as described in connection with FIGS. 1 and 2. The p$^-$ layer may be formed by implanting B or BF$_2$ ions, or by diffusing metal ions from the FEM gate unit. Boron ions may be implanted at an energy of 3 keV to 10 keV, while BF$_2$ ions are implanted with an energy level of between 15 keV and 50 keV. Ion concentration in both instances are in the range of $1 \cdot 10^{11}$ cm$^{-2}$ to $1 \cdot 10^{13}$ cm$^{-2}$.

Using a bulk CMOS substrate as an example to explain the fabrication process, the initial step is to fabricate n$^-$ well and p⁻ well structures, isolate these structures, and implant appropriate ions to provide threshold voltage adjustment for the transistors. Photoresist is used to mask the CMOS section of the wafer. Next, phosphorous ions are implanted at an energy of between 30 keV to 120 keV, with a dose of $1.0 \times 10^{12}$ cm$^{-2}$ to $5.0 \times 10^{13}$ cm$^{-2}$ to the p⁻ well where the FEM gate units are to be constructed. Multiple implantation steps, and/or thermal diffusion may be required to obtain an optimum donor distribution in the n⁻ layer. The photoresist is stripped away. The implanted n⁻ type silicon layer may also be replaced with a selective epitaxial growth of silicon with a thickness of 100 nm to 1000 nm. Boron (3 keV to 5 keV) or BF$_2$ (30 keV to 50 keV) ions are implanted, having a dose between $5.0 \cdot 10^{12}$ cm$^{-2}$ to $1.0 \cdot 10^{13}$ cm$^{-2}$. The ions are thermally activated.

Figure 6:
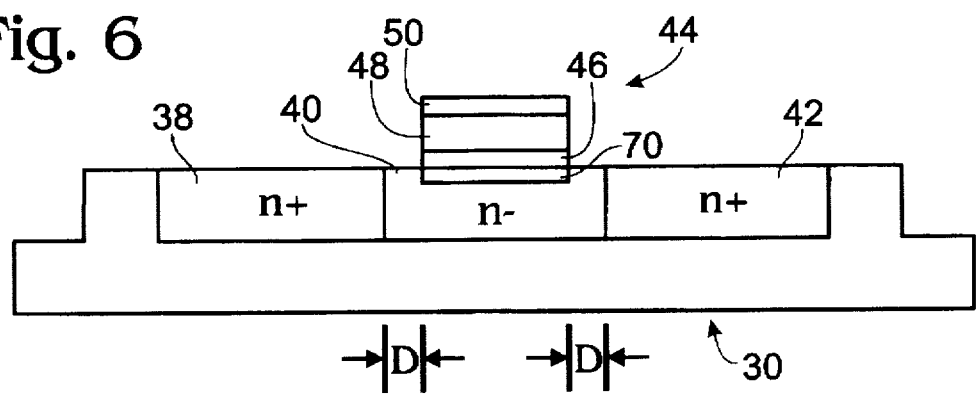
FIG. 6 depicts the second embodiment of the FEM gate unit of the invention, formed on a p⁻ conductive layer.

Referring now to FIG. 6, the FEM gate unit is now constructed as previously described by depositing Pt, or other suitable material to form lower electrode 46. The thickness of this metal is 20 nm to 100 nm. Boron or BF$_2$ ions may be implanted. The FE material 48 is deposited to a thickness of 100 nm to 400 nm, and upper electrode 50 is formed by depositing Pt, or other suitable electrode material to a thickness of 20 nm to 200 nm. Photoresist is applied, and the upper and lower electrodes, and the FE are etched to provide appropriate spacing "D" from the source region and the drain region, as previously described. The photoresist is then stripped from the structure. As explained in connection with FIG. 4, TiO (56), or another suitable barrier insulator is deposited by CVD to protect ferroelectric material. The TiO is etched to form sidewall insulator at the gate electrode. Additional oxide may be used for this step. Photoresist is again applied, and n⁺ ions are implanted. The photoresist is stripped away and oxide, or another suitable passivation insulator, is applied by CVD. The structure is heat treated to densify the passivation insulator and to activate implanted ions. Again, photoresist is applied, contact holes are etched, and the fabrication process completed by methods well known to those of skill in the art.

Regardless of the method used to form Schottky barrier 54 or shallow junction layer 70, the barrier structure serves to provide an efficient switching mechanism for the FEM cell of the invention.

Alternately, the source/drain ion implantation and annealing may be completed before the deposition of the lower gate electrode, if the ferroelectric material is unable to sustain high temperature heat treatment.

Operation

Figure 7:
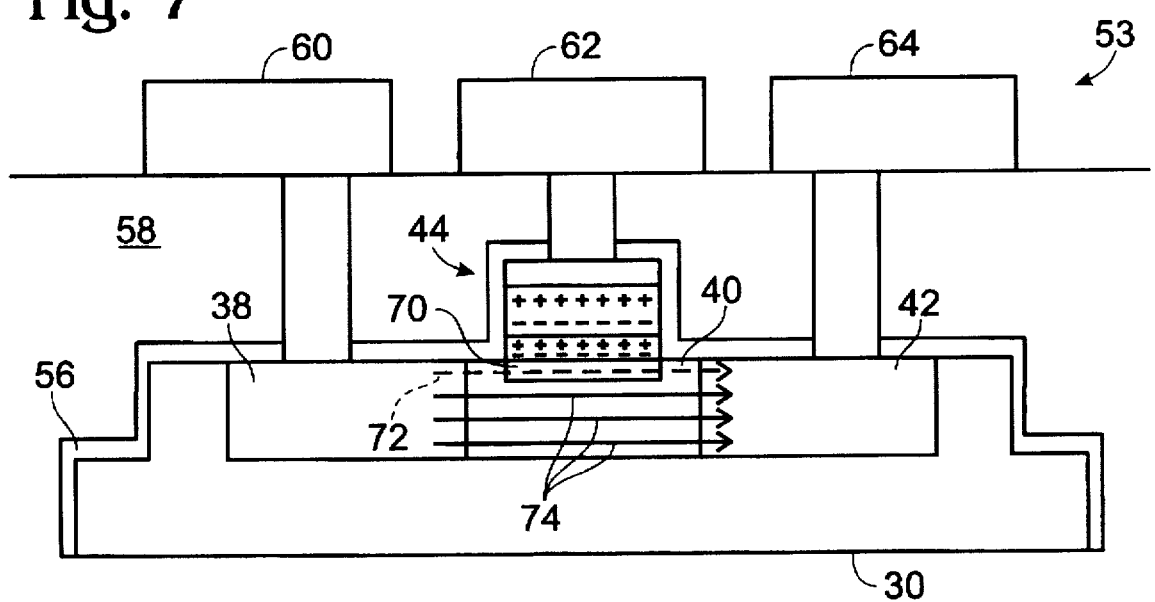
FIG. 7 depicts current flow in the FEM cell of the invention.

The structure constructed according to the invention is particularly efficient because the FEM gate unit, located over the conductive channel on the gate region, is able to shift the polarity of the gate region, allowing efficient current flow from the source through the gate to the drain. The structure provides for nearly total charge depletion when in an "off" condition, and efficient, low heat transmission of current when in an "on" condition. FIG. 7 is an enlarged view of the FEM cell of the invention, and depicts typical, prior art current flow represented by dashed line 72, wherein the current flows through gate region 40 only directly below the FEM gate unit. This is because known FEM cell configurations do not completely allow current flow through the gate region. Such structurtes may be thought of a switch that is partially "open." Solid lines 74 depict a completely "closed" switch of the instant invention, where current may flow through the entire gate region below barrier structure 70.

Memory cells constructed according to the invention may be placed in an array of memory cells such that the gate lines run perpendicular to the drain lines. In order to write to FEM gate unit 44, +V$_{P1}$ is applied to all gate electrodes, while the source and drain electrodes of the memory cell are at the ground potential. This polarizes FE 48 such that a positive charge is located at lower electrode 46 and a negative charge is located at upper electrode 50. (See FIG. 8b). This places FEM gate unit 44 in a high conductive state.

When a negative voltage, −V$_{PO}$, is applied to the gate electrode (program line), and a positive voltage, +V$_{PO}$ is applied to the drain, and the source is grounded, and where |V$_{P1}$|>|V$_{PO}$|, the FE is polarized with a negative charge at lower electrode 46. This places FEM gate unit 44 in a low conductive state. (see FIG. 8a). The write process enables each memory transistor in a memory array to be written to independent of other memory cells in the array, with no interference to or from the threshold voltages of the other memory cells in the array.

The threshold voltage for FEM gate unit 44 may be determined as follows: for a large scale array the threshold voltage at the "1" state has to be a positive value, i.e., 0.4V to 0.8V. The threshold voltage for the "0" state has to be larger than the supply voltage, i.e., 3.3 V. The n⁻ channel layer is depleted by the p⁻ type substrate junction as well as by the lower electrode Schottky barrier, or the very shallow p⁻ surface layer and the gate bias voltage. It can be shown that the memory window is equal to:

$$\Delta V_T = \frac{2Q_{FE}}{C_{FE}} \tag{1}$$

where Q$_{FE}$ is the remanent charge and C$_{FE}$ is the ferroelectric capacitance of the gate unit.

During a read operation, a voltage, V$_a$, of no larger than the coercive voltage, i.e., that voltage where the memory content may change, is applied to the gate electrode and the drain electrode. Because the content of the memory cell is not disturbed when any electrode is biased with V$_a$, the read operation will not disturb the memory contents of any memory cell. Therefor, a long charge retention is obtained.

A One Transistor Memory Cell

The general I$_D$ vs. V$_G$ plot for the MFMOS FET is depicted in FIG. 9. FIG. 9a depicts the I$_D$ vs. V$_G$ characteristics of a FEM cell with high channel doping, N$_D$. The centerline is the I$_D$ vs. V$_0$ curve when the FEM gate unit is not charged. When the FEM cell is programmed to a "1" state, the threshold voltage of the FEM cell is negative. Thus, a large drain current may flow through the channel region even if V$_G$=0 V. Such a device is not suitable for large scale array applications.

FIG. 9b depicts the I$_D$ vs. V$_G$ characteristics of a FEM cell with low channel doping N$_D$. The threshold voltage of the FEM cell when it is programmed to a "1" state is positive. No current may flow through the device when the gate is at ground potential. A large scale memory array of such devices will have a very small standby leakage current, and will not require frequent refreshing.

Ferroelectric Pb$_5$Ge$_3$O$_{11}$ Thin Film for MFMOS Applications

It can be shown that the lower ferroelectric capacitance results in higher memory window and lower programming voltage. Thicker film and lower ε$_r$ material can result in lower ferroelectric capacitance; however, the former choice could increase the programming voltage if the switching field for ferroelectric is well defined. Common oxide ferroelectric materials exhibit higher ε$_r$ and T$_c$, while non-oxide ferroelectrics exhibit lower ε$_r$ and T$_c$. Oxide Pb$_5$Ge$_3$O$_{11}$ thin film has very low ε$_r$ and moderate T$_c$ (178° C.). Table I compares the memory window of MFMOS devices with ferroelectric gate of $Pb_5Ge_3O_{11}$, PZT and $SrBi_2Ta_2O_9$ thin films. Even though the steady state polarization for $Pb_5Ge_3O_{11}$ thin film is much lower than that for PZT and $SrBi_2Ta_2O_9$ film films, the memory window for $Pb_5Ge_3O_{11}$ gate controlled MFMOS device is larger than its counterparts due to its low $\epsilon_r$.

TABLE I

Memory Windows for MFMOS Devices with Various Ferroelectrics

| Ferroelectric | $Pb(Zr,Ti)O_3$ | $SrBi_2Ta_2O_9$ | $Pb_5Ge_3O_{11}$ |
|---|---|---|---|
| $P_r$ ($\mu C/cm^2$) | 15 | 7 | 3.5 |
| $\epsilon_r$ | 1000 | 280 | 35 |
| $d_{Ferro}$ (Å) | 2000 | 2000 | 2000 |
| $V_{dep}$ (V) | 3.14 | 4.39 | 6.87 |
| $P_r^*$ ($\mu C/cm^2$) when $V_{dep}$ = 0.5 V | 2.4 | 0.8 | 0.25 |
| Memory Window $2P_r^*/C_{FE}$ (V) | 1.08 | 1.29 | 3.23 |

Gate oxide ($SiO_2$) thickness: 100 Å
Steady state $V_{dep}$ is assumed to be 0.5 V Thus, a FEM memory cell, and a method of constructing same has been disclosed. The FEM gate unit may be constructed as a single transistor device, or it may be constructed with an associated MOS transistor. Although a preferred embodiment of the invention has been disclosed, it should be appreciated that further variations may be made to the architecture and method without departing from the scope of the invention as defined in the appended claims.

We claim:

1. A method of forming a semiconductor structure having a ferroelectric memory (FEM) gate unit on a substrate of single crystal silicon, comprising:

forming a silicon device area for the FEM gate unit;

implanting doping impurities in the silicon device area to form a conductive channel of a first conductivity type for use as a source junction region and a drain junction region;

etching an insulating boundary about the device area;

forming a gate junction region between the source junction region and drain junction region for the FEM gate unit on the silicon device area;

forming a conductive channel precursor layer on the gate junction region; and depositing an FEM gate unit over the gate junction region, including depositing a lower metal layer, a ferroelectric (FE) layer and an upper metal layer, wherein the FEM gate unit is sized on the gate junction region such that any edge of the FEM gate unit is a distance "D" from the edges of the source junction region and the drain junction region, where "D" is between about 50 nm and 300 nm.

2. The method of claim 1 wherein forming a conductive channel precursor includes implanting a dopant taken from the group consisting of B and $BF_2$ at an energy in a range of 3 keV to 10 keV or 15 keV to 50 keV, respectively, and a dose of $1 \cdot 10^{11}$ $cm^{-2}$ to $1 \cdot 10^{13}$ $cm^{-2}$ to form the conductive channel precursor.

3. The method of claim 1 which includes annealing the structure at a temperature of about 500° C. to 1100° C. to diffuse ions from the lower metal layer into the gate junction region to form the conductive channel precursor.

4. The method of claim 1 wherein said depositing the FEM gate unit includes depositing a lower metal layer of Pt, having a thickness of about 20 nm to 100 nm, depositing a FE layer of material taken from the group consisting of $Pb(Zr, Ti)O_3$ (PZT), $SrBi_2Ta_2O_9$ (SBT), $Pb_5Ge_3O_{11}$ $BaTiO_3$ and $LiNbO_3$, having a thickness of about 100 nm to 400 nm, and depositing an upper metal layer of material taken from the group consisting of Pt, Ir and Pt/Ir alloy, having a thickness of 20 nm to 100 nm.

5. The method of claim 1 wherein said implanting doping impurities includes doping the device area with ions taken from the group consisting of As, implanted at an energy of about 40 keV to 70 keV, and phosphorous, implanted at an energy of about 30 keV to 60 keV, the ions having a dose of about $2 \cdot 10^{15}$ $cm^{-2}$ to $5 \cdot 10^{15}$ $cm^{-2}$.

6. The method of claim 1 which includes depositing a layer of TiO over the FEM gate unit.

7. A method of forming a semiconductor structure having a ferroelectric memory (FEM) gate unit on a substrate of single crystal silicon comprising:

forming a silicon device area for the FEM gate unit;

implanting doping impurities in the device area to form a conductive channel of a first conductivity type for use as a source junction region and a drain junction region;

etching an insulating boundary about adjacent device areas;

forming a gate junction region between the source junction region and drain junction region for the FEM gate unit on the device area;

forming a conductive channel precursor on the gate junction region; and depositing an FEM gate unit over the gate junction region, including depositing a lower metal layer of material taken from the group consisting of Pt, Ir and Pt/It alloy, having a thickness of about 20 nm to 100 nm, depositing a ferroelectric (FE) layer of material taken from the group consisting of $Pb(Zr, Ti)O_3$ (PZT), $SrBi_2Ta_2O_9$ (SBT), $Pb_5Ge_3O_{11}$ $BaTiO_3$ and $LiNbO_3$, having a thickness of about 100 nm to 400 nm, and depositing an upper metal layer of material taken from the group consisting of Pt, Ir and Pt/Ir alloy, having a thickness of 20 nm to 100 nm, wherein the FEM gate unit is formed on the gate junction region such that any edge of the FEM gate unit is a distance "D" from the edges of the source junction region and the drain junction region, where "D" is between about 50 nm and 300 nm.

8. The method of claim 7 wherein forming a conductive channel precursor includes implanting a dopant taken from the group consisting of B and $BF_2$ at an energy in a range of 3 keV to 10 keV or 15 keV to 50 keV, respectively, and a dose of $1 \cdot 10^{11}$ $cm^{-2}$ to $1 \cdot 10^{13}$ $cm^{-2}$ to form the conductive channel precursor.

9. The method of claim 7 which includes annealing the FEM cell at a temperature of about 500° C. to 1100° C. to diffuse ions from the lower metal layer of the FEM gate unit into gate junction region to form the conductive channel precursor layer.

10. The method of claim 7 which includes forming a channel of the second conductivity type having a thickness of about 50 nm to 100 nm.

11. The method of claim 7 wherein said implanting doping impurities includes doping the device area with ions taken from the group consisting of As, implanted at an energy of about 40 keV to 70 keV, and phosphorous, implanted at an energy of about 30 keV to 60 keV, the ions having a dose of about $2 \cdot 10^{15}$ $cm^{-2}$ to $5 \cdot 10^{15}$ $cm^{-2}$.

12. The method of claim 7 which includes depositing a layer of TiO over the FEM gate unit.

13. The method of claim 7 wherein the conductive channel precursor layer underlies the margins of the FEM gate unit.

14. A ferroelectric memory (FEM) cell comprising:

a single-crystal silicon substrate including an active region therein;

a source junction region and a drain junction region located in said active region, doped to form a pair of conductive channels of a first conductivity type;

a gate junction region located in said active region between said source junction region and said drain junction region, doped to form a conductive channel of a second conductivity type;

a conductive channel precursor region located on said gate junction region;

a FEM gate unit including a lower metal layer, a ferroelectric (FE) layer and an upper metal layer; wherein said FEM gate unit is sized on the gate junction region such that any edge of said FEM gate unit is a distance "D" from the edges of said source junction region and said drain junction region, where "D" is between about 50 nm and 300 nm;

an insulating layer, having an upper surface, overlying said junction regions, said FEM gate unit and said substrate;

a source electrode and a drain electrode, each located on the upper surface of said insulating layer and extending therethrough to make electrical contact with their respective junction regions, and a gate electrode located on the upper surface of said insulating layer and extending therethrough to make electrical contact with the upper metal layer of said FEM gate unit.

15. The FEM cell of claim 14 wherein said conductive channel precursor includes Pt ions therein which diffuse from the lower metal layer of said FEM gate unit during annealing of the structure at a temperature of about 500° C. to 1100° C.

16. The FEM cell of claim 14 wherein said conductive channel precursor includes ions implanted therein, and wherein the ions are taken from the group consisting of B and $BF_2$, implanted at an energy in a range of 3 keV to 10 keV and 15 keV to 50 keV, respectively, and a dose of $1 \cdot 10^{11}$ $cm^{-2}$ to $1 \cdot 10^{13}$ $cm^{-2}$.

17. The FEM cell of claim 14 wherein said FEM gate unit includes a lower metal layer of Pt, having a thickness of about 20 nm to 100 nm, a FE layer of material taken from the group consisting of $Pb(Zr, Ti)O_3$ (PZT), $SrBi_2Ta_2O_9$ (SBT), $Pb_5Ge_3O_{11}$, $BaTiO_3$ and $LiNbO_3$, having a thickness of about 100 nm to 400 nm, and an upper metal layer of material taken from the group consisting of Pt, Ir and Pt/Ir alloy, having a thickness of 20 nm to 100 nm.

18. The FEM cell of claim 14 wherein said active region includes ions taken from the group consisting of As, implanted at an energy of about 40 keV to 70 keV, and phosphorous, implanted at an energy of about 30 keV to 60 keV, the ions having a dose of about $2 \cdot 10^{15}$ $cm^{-2}$ to $5 \cdot 10^{15}$ $cm^{-2}$.

* * * * *